United States Patent [19]
Inagaki

[11] Patent Number: 5,349,307
[45] Date of Patent: Sep. 20, 1994

[54] CONSTANT CURRENT GENERATION CIRCUIT OF CURRENT MIRROR TYPE HAVING EQUAL INPUT AND OUTPUT CURRENTS

[75] Inventor: Kiyoshi Inagaki, Tokyo, Japan

[73] Assignee: NEC Corporation, Tokyo, Japan

[21] Appl. No.: 21,750

[22] Filed: Feb. 19, 1993

[30] Foreign Application Priority Data

Feb. 19, 1992 [JP] Japan .................................. 4-031202

[51] Int. Cl.[5] .............................................. H03F 3/16
[52] U.S. Cl. ...................................... 330/288; 330/300
[58] Field of Search ...................... 330/288, 296, 300; 323/315, 316; 307/296

[56] References Cited

U.S. PATENT DOCUMENTS 4,237,414 12/1980 Stein ........................ 330/288 X
4,801,892 1/1989 Yanakoshi et al. ................. 330/288

FOREIGN PATENT DOCUMENTS 1-321706 12/1989 Japan .

Primary Examiner—Steven Mottola
Attorney, Agent, or Firm—Young & Thompson

[57] ABSTRACT

A constant current generation circuit includes a current mirror circuit having an input PMOS transistor connected in the form of a diode connected in series to a constant current source. With a constant current $I_0$ of the constant current source, a drain voltage $V_2$ of the input PMOS transistor is set to a value near to the threshold voltage of the input PMOS transistor. A gate of the input PMOS transistor is connected to a gate of output PMOS transistor having its drain connected to an emitter of a PNP transistor, which has its base biased with an appropriate voltage. With this arrangement, a drain voltage $V_1$ of the output PMOS transistor can be made equal to the drain voltage $V_2$ of the input PMOS transistor, and therefore, the input current $I_0$ flowing through the input PMOS transistor can be made equal to an output current $I_1$ flowing through the output PMOS transistor.

14 Claims, 4 Drawing Sheets

CONSTANT CURRENT GENERATION CIRCUIT OF CURRENT MIRROR TYPE HAVING EQUAL INPUT AND OUTPUT CURRENTS

BACKGROUND OF THE INVENTION

1. Field of the Invention

The present invention relates to a constant current generation circuit, and more specifically to a constant current generation circuit composed of a current mirror circuit.

2. Description of Relates Art

A typical example of the constant current generation circuit of this type is disclosed in Japanese Patent Laid-open Publication No. Hei 1-321706. For example, the constant current generation circuit shown in FIG. 1 of this Japanese patent laid-open publication includes a constant current source 1 connected in series to an input current path of a MOS transistor current mirror circuit 2, and a bipolar transistor current mirror circuit 3 having an input current path connected in series through a load resistor $R_3$ to an output current path of the MOS transistor current mirror circuit 2, an output current path of the bipolar transistor current mirror circuit 3 constituting an output of the constant current generation circuit.

The constant current source 1 includes a resistor $R_2$ and three series-connected diodes $D_1$, $D_2$ and $D_3$, which are connected in series between a ground and a low potential power supply line $V_{EE}$. A constant voltage obtained across the three series-connected diodes $D_1$, $D_2$ and $D_3$ is applied to a base of an NPN bipolar transistor $Q_4$, so that a constant current $I_0$ passes through the NPN bipolar transistor $Q_4$. The value of this constant current $I_0$ can be adjusted by a resistor $R_1$ connected between an emitter of the NPN bipolar transistor $Q_4$ and the low potential power supply line $V_{EE}$.

In general, a current mirror circuit includes an input transistor and an output transistor, which have their gates or bases connected to each other. One end of a main current path of the input transistor and one end of a main current path of the output transistor are connected in common to the same power supply line. The gate or base and the other end of the main current path of the input transistor are connected to each other. With this arrangement, if a predetermined current is caused to pass through the input transistor, the output transistor is controlled to pass the predetermined current therethrough.

In FIG. 1 of Japanese Patent Laid-open Publication No. Hei 1-321706, current $I_0$ passing through an input PMOS transistor $T_2$ of the MOS transistor current mirror circuit 2 is transferred or copied to an output PMOS transistor $T_1$ of the MOS transistor current mirror circuit 2, which supplies a constant current $T_1$ to an input NPN bipolar transistor $Q_1$ of the bipolar transistor current mirror circuit 3. In this case, the load resistor $R_3$ functions to compensate for a drain voltage of the output PMOS transistor $T_1$. In the bipolar transistor current mirror circuit 3, the current $I'_1$ passing through the input NPN bipolar transistor $Q_1$ is transferred or copied to an output NPN bipolar transistor $Q_2$, so that a constant current $I'_2$ is generated at a collector of the output NPN bipolar transistor $Q_2$.

In the above mentioned constant current generation circuit, in the case that the two PMOS transistors $T_1$ and $T_2$ of the current mirror circuit 2 have an inclined current-voltage characteristics in a saturated region, if a drain voltage of the PMOS transistor $T_2$ becomes different from a drain voltage of the PMOS transistor $T_1$, the currents flowing through the respective PMOS transistors $T_1$ and $T_2$ becomes unequal.

SUMMARY OF THE INVENTION

Accordingly, it is an object of the present invention to provide a constant current generation circuit which has overcomes the above mentioned defect of the conventional one.

Another object of the present invention is to provide a constant current generation circuit of the current mirror type which can make an input current and an output current equal to each other regardless of variation of a power supply voltage.

The above and other objects of the present invention are achieved in accordance with the present invention by a constant current generation circuit comprising:

a constant current source having a first end connected to a first voltage supply line, and a second end, and so configured to allow a first constant current to flow through the constant current source between the first end and the second end;

a first current mirror circuit composed of a first input transistor and a first output transistors having their control electrode interconnected to each other, one end of a main current path of the first input transistor and one end of a main current path of the first output transistor being connected in common to a second voltage supply line, the other end of the main current path of the first input transistor being connected to the control electrode of the first input transistor and the second end of the constant current source so that the first constant current flows through the first input transistor;

a bipolar transistor having an emitter connected to the other end of the main current path of the first output transistor, a collector of the bipolar transistor supplying a constant output current, and a base of the bipolar transistor being biased with an appropriate voltage so that a voltage of the output terminal of the current mirror circuit is made substantially equal to the voltage of the input terminal of the current mirror circuit, thereby minimizing a current transmission error between the input terminal and the output terminal of the current mirror circuit.

The above and other objects, features and advantages of the present invention will be apparent from the following description of preferred embodiments of the invention with reference to the accompanying drawings.

DESCRIPTION OF THE PREFERRED EMBODIMENTS

Figure 1:
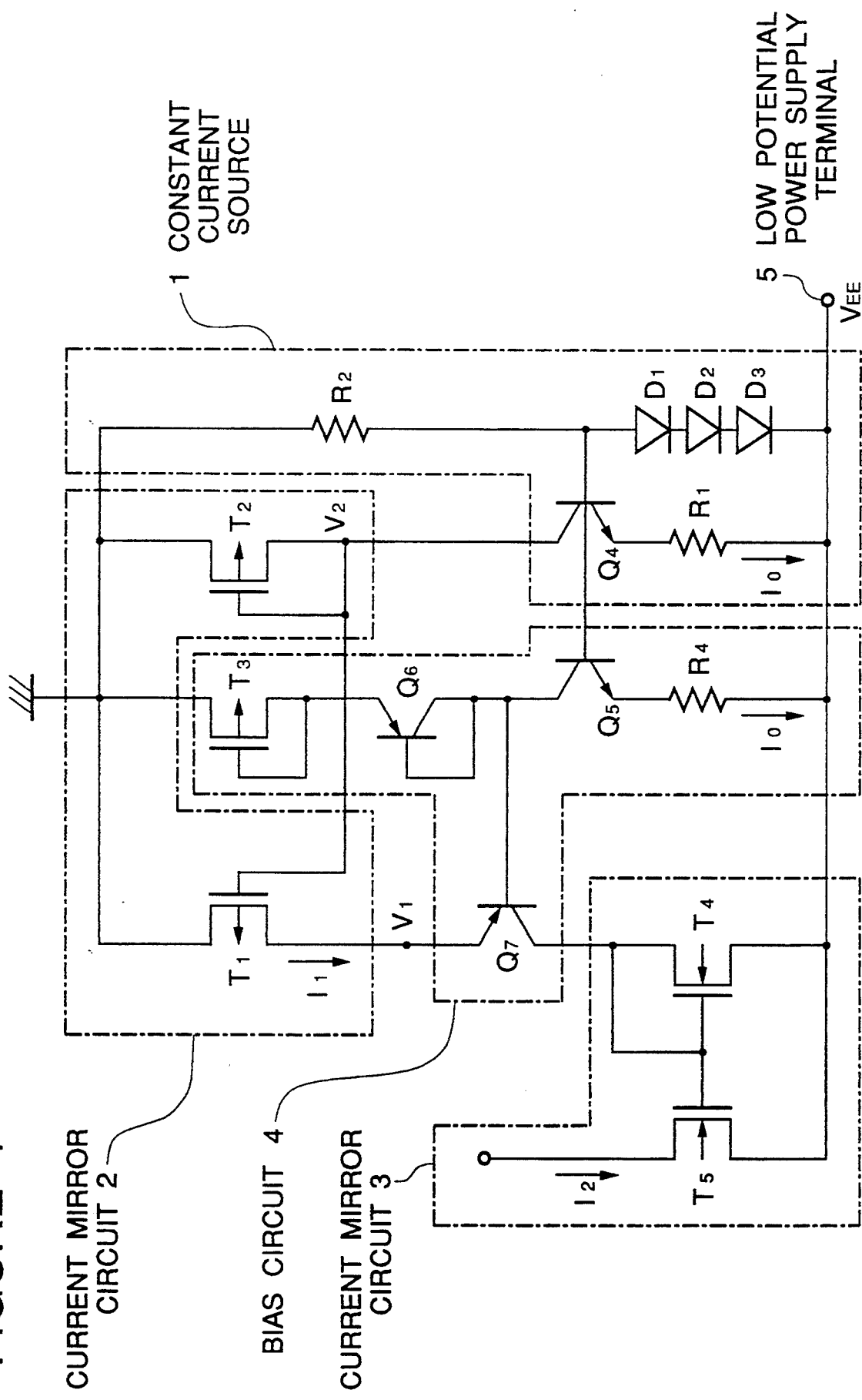
FIG. 1 is a circuit diagram of a first embodiment of the constant current generation circuit in accordance with the present invention.

Referring to FIG. 1, there is shown a circuit diagram of a first embodiment of the constant current generation circuit in accordance with the present invention.

The shown embodiment generally comprises a constant current source 1, a first current mirror circuit 2, a second current mirror circuit 3 and a bias circuit 4, connected as shown. The constant current source 1 includes a constant voltage generating circuit composed of three forward direction series-connected diodes $D_1$, $D_2$ and $D_3$ and a resistor $R_2$, which are connected in series between a ground and a power supply terminal 5 of a low potential $V_{EE}$. A cathode of the diode $D_3$ is connected to the power supply terminal 5 of the low potential $V_{EE}$, and the resistor R2 is connected at its one end of the ground and at its other end to an anode of the diode $D_1$. The constant current source 1 also includes an NPN transistor $Q_4$ having its base connected to a connection node between the resistor $R_2$ and the diode $D_1$. An emitter of the NPN transistor $Q_4$ is connected through a resistor $R_1$ to the power supply terminal 5 for $V_{EE}$.

The first current mirror circuit 2 includes an input P-channel MOS transistor $T_2$ and an output P-channel MOS transistor $T_1$, which have their gate interconnected to each other and their source connected in common to the ground. A drain of the input transistor $T_2$ is connected to the gate of the input transistor $T_2$ itself. Namely, the input transistor $T_2$ is connected in the form of a diode. The input transistor $T_2$ is also connected to a collector of the transistor $Q_4$ of the constant current source 1.

The second current mirror circuit 3 includes an input N-channel MOS transistor $T_4$ and an output N-channel MOS transistor $T_5$, which have their gate interconnected to each other and their source connected in common to the power supply line 5 for the low potential $V_{EE}$. A drain of the input transistor $T_4$ is connected to the gate of the input transistor $T_4$ itself. Namely, the input transistor $T_4$ is connected in the form of a diode. The input transistor $T_4$ is also connected through the bias circuit 4 to a drain of the output N-channel MOS transistor $T_1$. On the other hand, a drain of the input transistor $T_5$ is connected so as to supply a constant output current $I_2$.

The bias circuit 4 includes an NPN transistor $Q_5$ having its base connected to the connection node between the resistor $R_2$ and the diode $D_1$, similarly to the NPN transistor $Q_4$, and an emitter of the NPN transistor $Q_5$ is connected through a resistor $R_2$ to the power supply terminal 5 for $V_{EE}$. The bias circuit 4 also includes a P-channel MOS transistor $T_3$ having its source connected to the ground and its drain connected to a gate of the P-channel MOS transistor $T_3$ itself so as to function as a diode, and a PNP transistor $Q_6$ having its emitter connected to the drain of the P-channel MOS transistor $T_3$ and its collector connected to a base of the PNP transistor $Q_6$ itself so as to function as a diode. In addition, the collector of the PNP transistor $Q_6$ is connected to a collector of the NPN transistor $Q_5$, and also to a base of another PNP transistor $Q_7$ which has its emitter connected to the drain of the P-channel MOS transistor $T_1$ and its collector connected to the drain of the N-channel MOS transistor $T_4$.

Now, operation of the first embodiment will be described. A bias voltage defined by the three series-connected diodes $D_1$, $D_2$ and $D_3$ is applied to the base of the NPN transistors $Q_4$ and $Q_5$, so that these NPN transistors are biased in a forward direction, and a constant current $I_0$ flows through each of these NPN transistors. This constant current $I_0$ is determined or adjusted by the emitter bias resistors $R_1$ and $R_4$. With this constant current $I_0$, a drain voltage $V_2$ of the PMOS transistor $T_2$ connected in the form of diode is set to a value near to a threshold voltage of the PMOS transistor $T_2$.

The gate of the PMOS transistor $T_1$ is applied with the gate voltage of the PMOS transistor $T_2$. A drain voltage $V_1$ of the PMOS transistor $T_1$ is set by an emitter voltage of the PNP transistor $Q_7$. At this time, a base voltage of the PNP transistor $Q_7$ is set to $V_2+V_{BE}$, where $V_{BE}$ is a base-emitter voltage of the PNP transistor $Q_7$. If the P-channel MOS transistor $T_3$ has the same characteristics as that of the P-channel MOS transistor $T_2$ and the PNP transistor $Q_6$ has the same characteristics as that of the PNP transistor $Q_7$, the P-channel MOS transistor $T_3$ connected in the form of a diode gives a voltage drop equal to the drain voltage $V_2$ voltage $V_{BE}$ of the PNP transistor $Q_7$. Thus, the bias voltage $V_2+V_{BE}$, is applied to the base of the PNP transistor $Q_7$ by cooperation of the P-channel MOS transistor $T_3$ and the PNP transistor $Q_6$.

With this arrangement, the drain voltage $V_1$ of the PMOS transistor $T_1$ becomes equal to the drain voltage $V_2$ of the PMOS transistor $T_2$, and therefore, a current $I_1$ flowing through the PMOS transistor $T_1$ becomes equal to the current $I_0$ flowing through the PMOS transistor $T_2$. In this embodiment, for example, even if the power supply voltage $V_{EE}(=-4.5\text{ V})$ varies in the range of $\pm 10\%$, a current transmission error $\{(I_1-I_0)/I_0\}\times 100\%$ was not greater than 2%.

Figure 2:
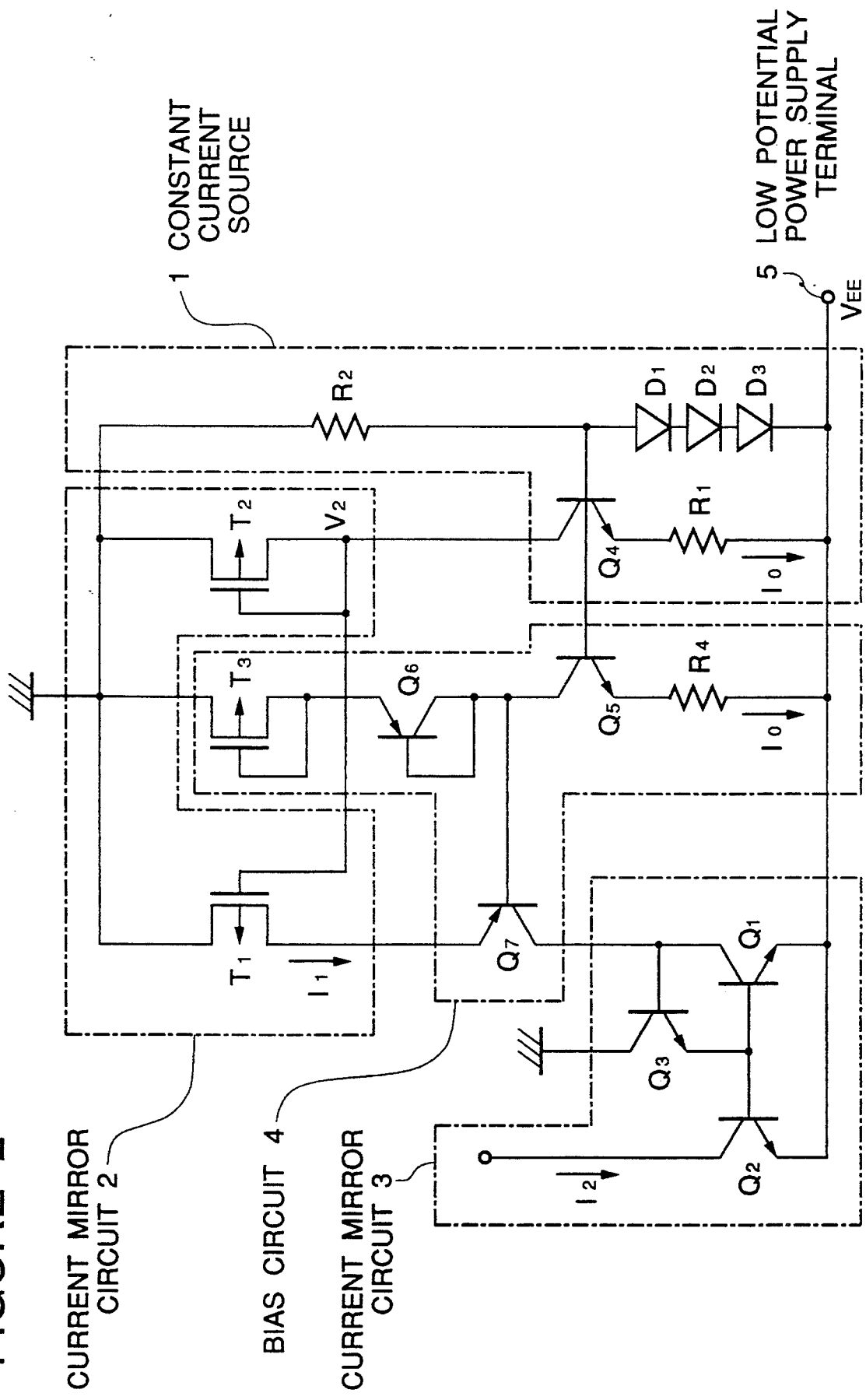
FIG. 2 is a circuit diagram of a second embodiment of the constant current generation circuit in accordance with the present invention.

Referring to FIG. 2, there is shown a circuit diagram of a second embodiment of the constant current generation circuit in accordance with the present invention. In FIG. 2, elements similar or corresponding to those shown in FIG. 1 are given the same Reference Numerals, and explanation thereof will be omitted. The second embodiment is different from the first embodiment only in that the current mirror circuit 3 is composed of only bipolar transistors, in place of the MOS transistors $T_4$ and $T_5$.

Namely, the second current mirror circuit 3 includes an input NPN transistor $Q_1$ and an output NPN transistor $Q_2$, which have their base interconnected to each other and their emitter connected in common to the power supply line 5 for the low potential $V_{EE}$. A collector of the input NPN transistor $Q_1$ is connected to the collector of the PNP transistor $Q_7$ and a base of another NPN transistor $Q_3$, which has its collector connected to the ground and its emitter connected to the base of the input NPN transistor $Q_1$. On the other hand, a collector of the output NPN transistor $Q_2$ is connected so as to supply a constant output current $I_2$. In this second embodiment, an advantage similar to the first embodiment can be obtained, since the drain voltage $V_1$ of the PMOS transistor $T_1$ becomes equal to the drain voltage $V_2$ of the PMOS transistor $T_2$.

Figure 3A:
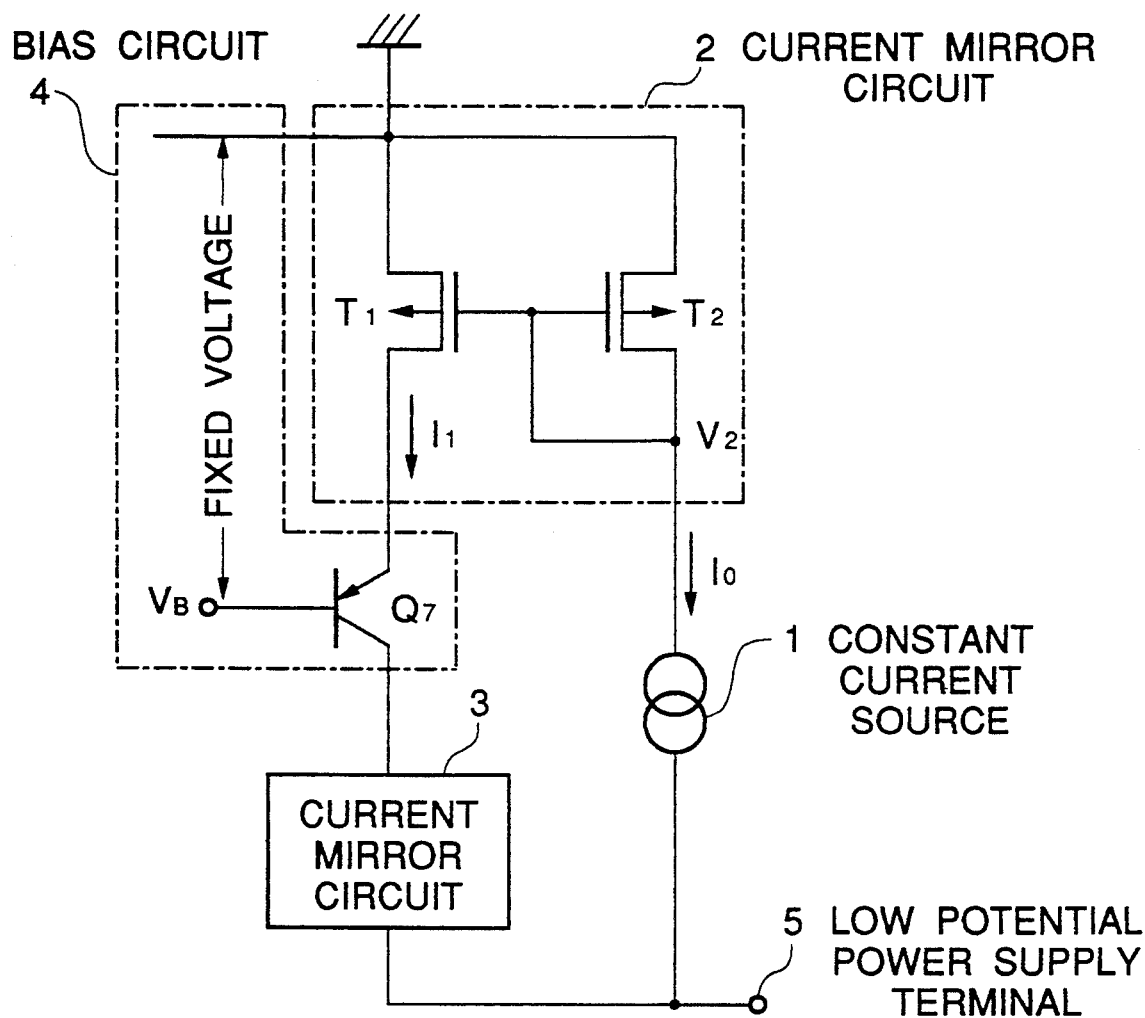
FIGS. 3A and 3B are circuit diagram of third and fourth embodiments of the constant current generation circuit in accordance with the present invention.

Referring to FIG. 3A, there is shown a circuit diagram of a third embodiment of the constant current generation circuit in accordance with the present invention. The third embodiment is a modification of the first embodiment, and therefore, in FIG. 3, elements similar or corresponding to those shown in FIG. 1 are given the same Reference Numerals, and explanation thereof will be omitted. In addition, the details of the constant current source 1 and the current mirror circuit 3 are omitted.

This third embodiment is different from the first embodiment in that the bias circuit 4 is modified so as to supply a fixed bias voltage to the base of the PNP transistor $Q_7$. Namely, by making a base bias voltage $V_B$ of the PNP transistor $Q_7$ equal to $\{V_2+V_{BE}\}$, an advantage similar to the first embodiment can be obtained.

Figure 3B:
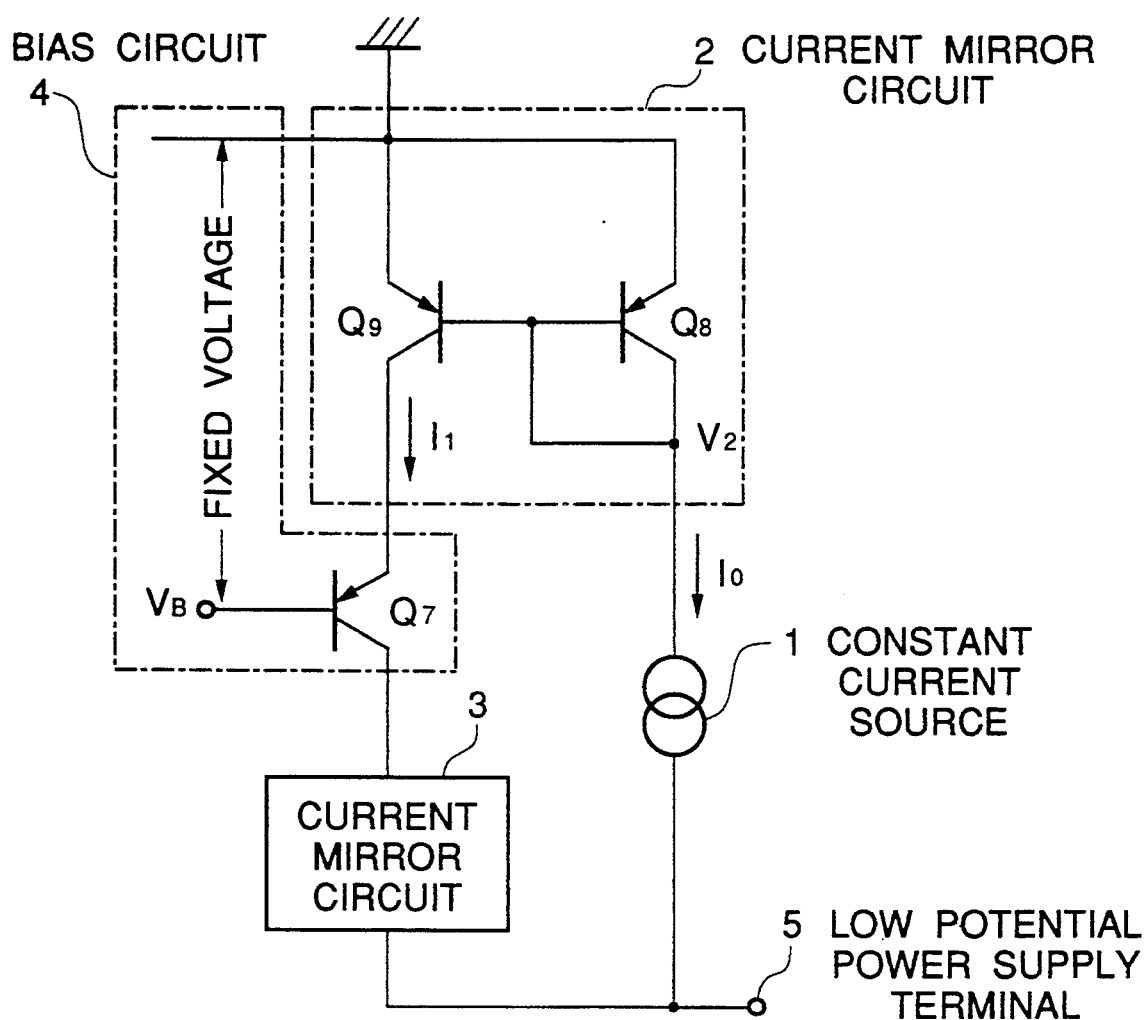

Referring to FIG. 3B, there is shown a circuit diagram of a fourth embodiment of the constant current generation circuit in accordance with the present invention. The fourth embodiment is a modification of the third embodiment, and therefore, in FIG. 4, elements similar or corresponding to those shown in FIG. 3 are given the same Reference Numerals, and explanation thereof will be omitted.

This fourth embodiment is different from the third embodiment in that the first current mirror circuit 2 includes an input PNP transistor $Q_8$ and an output PNP transistor $Q_9$, which have their base interconnected to each other and their emitter connected in common to the ground. A collector of the input PNP transistor $Q_8$ is connected to a base of the PNP transistor $Q_8$ itself and to the constant current source 1. On the other hand, a collector of the output PNP transistor $Q_9$ is connected to the emitter of the PNP transistor $Q_7$. In third fourth embodiment, an advantage similar to the third embodiment can be obtained.

In the above mentioned embodiments, the output constant current $I_2$ is supplied by the second current mirror circuit 3. However, the output current $I_1$ of the first current mirror circuit 2 is similarly a constant current, and therefore, it is a matter of course that the second current mirror circuit 3 can be omitted, and the output current $I_1$ of the first current mirror circuit 2 can be used as the constant output current of the constant current generation circuit in accordance with the present invention.

It would be understood to average persons in the art that the above mentioned embodiments can be modified by changing the P-channel MOS transistors, the N-channel transistors, the NPN transistors and the PNP transistors to N-channel MOS transistors, P-channel transistors, PNP transistors and NPN transistors, respectively and by inverting the potential relation between the ground and the power supply terminal 5.

As will be apparent from the above description of the embodiments with reference to the drawings, the constant current generation circuit in accordance with the present invention is characterized in that the output of the current mirror circuit is drawn through the bipolar transistor, so that the drain voltages of a pair of MOS transistors of the current mirror circuit can be made equal to each other regardless of variation in the power supply voltage, and therefore, the input current and the output current can be also made equal to each other.

The invention has thus been shown and described with reference to the specific embodiments. However, it should be noted that the present invention is in no way limited to the details of the illustrated structures but changes and modifications may be made within the scope of the appended claims.

I claim:

1. A constant current generation circuit comprising: a constant current source having a first end connected to a first voltage supply line, and a second end, and so configured to allow a first constant current to flow through said constant current source between said first end and said second end; a first current mirror circuit composed of a first input transistor and a first output transistors having their control electrode interconnected to each other, one end of a main current path of said first input transistor and one end of a main current path of said first output transistor being connected in common to a second voltage supply line, the other end of said main current path of said first input transistor being connected to said control electrode of said first input transistor and said second end of said constant current source so that said first constant current flows through said first input transistor; a PNP transistor having an emitter connected to the other end of said main current path of said first output transistor, a base of said PNP transistor being biased with an appropriate voltage, and a collector of said PNP transistor supplying a constant output current; wherein said constant current source includes a first constant current transistor having its control electrode biased with a fixed bias voltage, one end of a main current path of said first constant current transistor being connected to the other end of said main current path of said first input transistor, and the other end of said main current path of said first constant current transistor being connected through a first resistor to said first voltage supply line, and further including a bias circuit which comprises:

a second constant current transistor having its control electrode biased with said fixed bias voltage, one end of a main current path of said second constant current transistor being connected to said base of said PNP transistor, and the other end of said main current path of said second constant current transistor being connected through a second resistor to said first voltage supply line, and an active load having its one end connected to said base of said PNP transistor and its other end connected to said second voltage supply line, said active load giving a voltage drop which substantially equals to a volume drop across said main current path of said first input transistor plus a base-emitter voltage of said PNP transistor.

2. A constant current generation circuit claimed in claim 1 wherein said active load includes a P-channel MOS transistor having its source connected to said second voltage supply line and its drain connected to a gate of said P-channel MOS transistor itself, and a PNP transistor having its emitter connected to said drain of said P-channel MOS transistor and its base and its collector connected in common to said base of said PNP transistor.

3. A constant current generation circuit claimed in claim 1 wherein said first current mirror circuit includes an input P-channel MOS transistor and an output P-channel MOS transistor which have their gate interconnected to each other and their source connected in common to said second voltage supply line, a drain of said input P-channel MOS transistor being connected to said gate of said input P-channel MOS transistor itself and also connected to said one end of said main current path of said first constant current transistor, and a drain of said output P-channel MOS transistor being connected to said collector of said PNP transistor.

4. A constant current generation circuit claimed in claim 1 wherein said first current mirror circuit includes an input PNP transistor and an output PNP transistor which have their base interconnected to each other and their emitter connected in common to said second voltage supply line, a collector of said input PNP transistor being connected to a base of said input PNP transistor itself and also connected to said one end of said main current path of said first constant current transistor, and an emitter of the output PNP transistor being connected to said collector of said PNP transistor.

5. A constant current generation circuit claimed in claim 1 further including a second current mirror circuit composed of a second input transistor and a second output transistor having their control electrode interconnected to each other, one end of a main current path of said second input transistor and one end of a main current path of said second output transistor being connected in common to said first voltage supply line, the other end of said main current path of said second input transistor being connected to said control electrode of said second input transistor band said collector of said PNP transistor, and the other end of said main current path of said second output transistor supplying a constant output current.

6. A constant current generation circuit claimed in claim 5 wherein said second current mirror circuit includes an input N-channel MOS transistor and an output N-channel MOS transistor which have their gate interconnected to each other and their source connected in common to the first voltage supply line, a drain of the input N-channel MOS transistor being connected to said gate of the input N-channel MOS transistor itself and also connected to said collector of said PNP transistor, and a drain of said output N-channel MOS transistor supplying a constant output current.

7. A constant current generation circuit claimed in claim 5 wherein said second current mirror circuit includes an input NPN transistor and an output NPN transistor which have their base interconnected to each other and their emitter connected in common to the first power supply line, a collector of said input NPN transistor being connected to said collector of said PNP transistor and a base of a third NPN transistor, which has its collector connected to said second voltage supply line and its emitter connected to said base of said input NPN transistor, and a collector of said output NPN transistor supplying a constant output current.

8. A constant current generation circuit comprising:
a constant current source having a first end connected to a first voltage supply line, and a second end, and so configured to allow a first constant current to flow through said constant current source between said first end and said second end;
a first current mirror circuit composed of a first input transistor and a first output transistors having their control electrode interconnected to each other, one end of a main current path of said first input transistor and one end of a main current path of said first output transistor being connected in common to a second voltage supply line, the other end of said main current path of said first input transistor being connected to said control electrode of said first input transistor and said second end of said constant current source so that said first constant current flows through said first input transistor;
a bipolar transistor having an emitter connected to the other end of said main current path of said first output transistor, a base of said bipolar transistor being biased with an appropriate voltage, and a collector of said bipolar transistor supplying a constant output current;
wherein said constant current source includes a first constant current transistor having its control electrode biased with a fixed bias voltage, one end of a main current path of said first constant current transistor being connected to the other end of said main current path of said first input transistor, and the other end of said main current path of said first constant current transistor being connected through a first resistor to said first voltage supply line, and further including a bias circuit which comprises:
a second constant current transistor having its control electrode biased with said fixed bias voltage, one end of a main current path of said second constant current transistor being connected to said base of said bipolar transistor, and the other end of said main current path of said second constant current transistor being connected through a second resistor to said first voltage supply line, and
an active load having its one end connected to said base of said bipolar transistor and its other end connected to said second voltage supply line, said active load giving a voltage drop which substantially equals to a voltage drop across said main current path of said first input transistor plus a base-emitter voltage of said bipolar transistor.

9. A constant current generation circuit claimed in claim 8 wherein said base of said bipolar transistor is biased with a fixed voltage substantially equal to a voltage drop across said main current path of said first input transistor plus a base-emitter voltage of said bipolar transistor.

10. A constant current generation circuit comprising:
a constant current source having a first end connected to a first voltage supply line, and a second end, and so configured to allow a first constant current to flow through said constant current source between said first end and said second end;
a first current mirror circuit composed of a first input transistor and a first output transistors having their control electrode interconnected to each other, one end of a main current path of said first input transistor and one end of a main current path of said first output transistor being connected in common to a second voltage supply line, the other end of said main current path of said first input transistor being connected to said control electrode of said first input transistor and said second end of said constant current source so that said first constant current flows through said first input transistor;
a PNP transistor having an emitter connected to the other end of said main current path of said first output transistor, a base of said PNP transistor being biased with an appropriate voltage, and a collector of said PNP transistor supplying a constant output current;
wherein said base of said PNP transistor is biased with a fixed voltage substantially equal to a voltage drop across said main current path of said first input transistor plus a base-emitter voltage of said PNP transistor; and
wherein said first current mirror circuit includes an input P-channel MOS transistor and an output P-channel MOS transistor which have their gate interconnected to each other and their source connected in common to said second voltage supply line, a drain of said input P-channel MOS transistor being connected to said gate of said input P-channel MOS transistor itself and also connected to said second end of said constant current source, and a drain of said output P-channel MOS transistor being connected to said collector of said PNP transistor.

11. A constant current generation circuit comprising:
a constant current source having a first end connected to a first voltage supply line, and a second end, and so configured to allow a first constant current to flow through said constant current source between said first end and said second end;
a first current mirror circuit composed of a first input transistor and a first output transistors having their control electrode interconnected to each other, one end of a main current path of said first input transistor and one end of a main current path of said first output transistor being connected in common to a second voltage supply line, the other end of said main current path of said first input transistor being connected to said control electrode of said first input transistor and said second end of said constant current source so that said first constant current flows through said first input transistor;
a PNP transistor having an emitter connected to the other end of said main current path of said first output transistor, a base of said PNP transistor being biased with an appropriate voltage, and a collector of said PNP transistor supplying a constant output current;
wherein said base of said PNP transistor is biased with a fixed voltage substantially equal to a voltage drop across said main current path of said first input transistor plus a base-emitter voltage of said PNP transistor; and
wherein said first current mirror circuit includes an input PNP transistor and an output PNP transistor which have their base interconnected to each other and their emitter connected in common to said second voltage supply line, a collector of said input PNP transistor being connected to a base of said input PNP transistor itself and also connected to said second end of said constant current source, and an emitter of the output PNP transistor being connected to said collector of said PNP transistor.

12. A constant current generation circuit comprising:
a constant current source having a first end connected to a first voltage supply line, and a second end, and so configured to allow a first constant current to flow through said constant current source between said first end and said second end;
a first current mirror circuit composed of a first input transistor and a first output transistors having their control electrode interconnected to each other, one end of a main current path of said first input transistor and one end of a main current path of said first output transistor being connected in common to a second voltage supply line, the other end of said main current path of said first input transistor being connected to said control electrode of said first input transistor and said second end of said constant current source so that said first constant current flows through said first input transistor;
a PNP transistor having an emitter connected to the other end of said main current path of said first output transistor, a base of said PNP transistor being biased with an appropriate voltage, and a collector of said PNP transistor supplying a constant output current;
wherein said base of said PNP transistor is biased with a fixed voltage substantially equal to a voltage drop across said main current path of said first input transistor plus a base-emitter voltage of said PNP transistor; and
further including a second current mirror circuit composed of a second input transistor and a second output transistor having their control electrode interconnected to each other, one end of a main current path of said second input transistor and one end of a main current path of said second output transistor being connected in common to said first voltage supply line, the other end of said main current path of said second input transistor being connected to said control electrode of said second input transistor and said collector of said PNP transistor, and the other end of said main current path of said second output transistor supplying a constant output current.

13. A constant current generation circuit claimed in claim 12 wherein said second current mirror circuit includes an input N-channel MOS transistor and an output N-channel MOS transistor which have their gate interconnected to each other and their source connected in common to the first voltage supply line, a drain of the input N-channel MOS transistor being connected to said gate of the input N-channel MOS transistor itself and also connected to said collector of said PNP transistor, and a drain of said output N-channel MOS transistor supplying a constant output current.

14. A constant current generation circuit claimed in claim 12 wherein said second current mirror circuit includes an input NPN transistor and an output NPN transistor which have their base interconnected to each other and their emitter connected in common to the first power supply line, a collector of said input NPN transistor being connected to said collector of said PNP transistor and a base of a third NPN transistor, which has its collector connected to said second voltage supply line and its emitter connected to said base of said input NPN transistor, and a collector of said output NPN transistor supplying a constant output current.

* * * * *